United States Patent [19]

Tomita et al.

[11] Patent Number: 5,423,936
[45] Date of Patent: Jun. 13, 1995

[54] PLASMA ETCHING SYSTEM

[75] Inventors: Kazushi Tomita, Kawaguchi; Yoshikazu Ito, Yamanashi; Motohiro Hirano, Hachioji; Akira Nozawa, Nirasaki; Hiromitsu Matsuo, Shirane; Shunichi Iimuro, Yamanashi; Shigeki Tozawa, Nirasaki; Yutaka Miura, Koufu, all of Japan

[73] Assignees: Hitachi, Ltd.; Hitachi Tokyo Electronics, Co., Ltd.; Tokyo Electron Limited, all of Tokyo; Tokyo Electron Yamanashi Limited, Nirasaki, all of Japan

[21] Appl. No.: 138,039

[22] Filed: Oct. 19, 1993

[30] Foreign Application Priority Data

Oct. 19, 1992 [JP] Japan .................. 4-306121

[51] Int. Cl.6 ........................................... H01L 21/00
[52] U.S. Cl. .................. 156/345; 156/643.1; 204/298.33
[58] Field of Search ........................ 156/345, 643; 118/723 E; 204/298.31, 298.33

[56] References Cited

U.S. PATENT DOCUMENTS

| | | | |
|---|---|---|---|
| 4,297,162 | 10/1981 | Mundt et al. | 156/643 |
| 4,931,135 | 6/1990 | Horiuchi et al. | 156/345 X |
| 5,022,979 | 6/1991 | Hijikata et al. | 156/345 X |

FOREIGN PATENT DOCUMENTS

| | | | |
|---|---|---|---|
| 60-39832 | 3/1985 | Japan | 156/345 |
| 61-292920 | 12/1986 | Japan | 156/345 |
| 63-187619 | 8/1988 | Japan | 118/723 E |
| 1-149964 | 6/1989 | Japan | 118/723 E |
| 2-73624 | 3/1990 | Japan | 118/724 |
| 2-101740 | 4/1990 | Japan . | |
| 2-114636 | 4/1990 | Japan . | |
| 2-122523 | 5/1990 | Japan . | |
| 2-155230 | 6/1990 | Japan . | |
| 2-244624 | 9/1990 | Japan . | |
| 4-37124 | 2/1992 | Japan | 118/723 E |

OTHER PUBLICATIONS

Wolf, *Silicon Processing for the VLSI Era*, 1986, pp. 568–569.

*Primary Examiner*—R. Bruce Breneman
*Assistant Examiner*—Jonathan D. Baskin
*Attorney, Agent, or Firm*—Oblon, Spivak, McClelland, Maier, & Neustadt

[57] ABSTRACT

The present invention provides a plasma etching system, comprising a process chamber enclosing a plasma, means for evacuating said process chamber, a chuck electrode for supporting a substrate, a shower electrode positioned to face said chuck electrode and provided with a large number of small holes, a power source for applying a plasma voltage between the chuck electrode and said shower electrode, gas supply means communicating with said small holes of the shower electrode for supplying a plasma-forming gas into the process chamber through the small holes, and means for controlling said gas supply means such that said plasma-forming gas flows through said small holes at a mass flow rate of at least 620 kg/m$^2$/hr.

5 Claims, 7 Drawing Sheets

PLASMA ETCHING SYSTEM

BACKGROUND OF THE INVENTION

1. Field of the Invention

The present invention relates to a plasma etching system and method for applying a plasma etching treatment to a substrate such as a semiconductor wafer, particularly to an improvement in a shower electrode of a high flow rate type used as an upper electrode of a parallel plate electrode type etching apparatus.

2. Description of the Related Art

A parallel plate electrode type plasma etching apparatus comprising a pair of electrodes facing each other is known to the art as an etching apparatus for a semiconductor wafer. In the etching apparatus of this type, a wafer is disposed on a lower electrode, and a plasma-forming gas such as a halogen gas or a freon gas is spurted toward the wafer through a large number of spurting holes formed in an upper electrode acting as a shower electrode. Also, a high frequency voltage is applied between the upper and lower electrodes so as to convert the gas into a plasma used for etching the wafer.

In the conventional etching apparatus, however, the upper electrode, i.e., shower electrode, is designed to achieve mainly a uniform plasma generation. In other words, sufficient attentions are not paid to the gas flow rate, the pitch of the gas spurting holes and the diameter of the gas spurting hole adapted for an optimum wafer etching.

In recent years, the pattern of a semiconductor device tends to become finer and finer. An anisotropic etching having a high aspect ratio is utilized for the manufacture of a semiconductor device having a finer pattern. For achieving an anisotropic etching with a high aspect ratio, it is necessary to set the inner pressure of the process chamber at a low level, leading to a plasma polymerization of the treating gas. As a result, a polymer containing C, O and F is deposited on the circumferential wall of the spurting holes. The deposited polymer film gradually grows with increase in the plasma discharge time to form a polymer film having a thickness of scores of microns. Finally, the polymer film drops in the form of lumps from the upper electrode onto the wafer so as to contaminate the wafer and, thus, to lower the yield of the semiconductor device.

What should also be noted is that the shower electrode used in the ordinary etching cannot be used for the anisotropic etching with a high aspect ratio, making it necessary to prepare a shower electrode used exclusively for the anisotropic etching.

SUMMARY OF THE INVENTION

The present invention, which has been achieved in an attempt to overcome the above-noted difficulties inherent in the prior art, is intended to provide a plasma etching system which can be continuously used stably over a long period of time and a plasma etching method using the particular etching apparatus.

According to an aspect of the present invention, there is provided a plasma etching system, comprising:
a process chamber enclosing a plasma;
means for evacuating the process chamber;
a chuck electrode for supporting a substrate;
a shower electrode positioned to face the chuck electrode and provided with a large number of small holes;
a power source for applying a plasma voltage between the chuck electrode and the shower electrode;
gas supply means communicating with the small holes of the shower electrode for supplying a plasma-forming gas into the process chamber through the small holes; and
means for controlling the gas supply means such that the plasma-forming gas flows through the small holes at a mass flow rate of at least 620 kg/m$^2$/hr.

According to another aspect of the present invention, there is provided a plasma etching method, comprising the steps of:
putting a substrate on a chuck electrode disposed in a process chamber;
evacuating the process chamber to set up a reduced pressure within the process chamber;
introducing a plasma-forming gas into the process chamber such that the gas flows through small holes made in a shower electrode at a mass flow rate of at least 620 kg/m$^2$/hr; and
applying voltage between the shower electrode and the chuck electrode to form a plasma between these two electrodes, the plasma acting on the substrate.

In the plasma etching system of the present invention, the gas supply means is controlled to permit the plasma-forming gas to flow through the small holes of the shower electrode at a high speed. Particularly, where the small holes are formed at a pitch of at least 6 mm and/or have a diameter smaller than 0.8 mm, the gas can be supplied to the shower electrode at a mass flow rate of at least 620 kg/m$^2$/hr. Incidentally, the term "mass flow rate" represents the mass of the fluid flowing through a fluid passageway per unit time.

The plasma polymerization reaction within the small holes is greatly affected by the gas flow speed. Where the small holes are formed at a small pitch or have a large diameter, the gas flows slowly, with the result that a plasma polymerization is likely to take place within the small holes so as to have the resultant polymer deposited on the circumferential wall of the small hole. To overcome the difficulty, the plasma-forming gas is supplied to the shower electrode at a mass flow rate of at least 620 kg/m$^2$/hr in the present invention. The particular gas supply system employed in the present invention permits suppressing the plasma polymerization within the small holes, with the result that a polymer is unlikely to be deposited on the circumferential wall of the small hole. Even if a polymer is formed, the polymer is blown away by the gas stream flowing at a high speed. It follows that the polymer is unlikely to grow into bulky lumps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
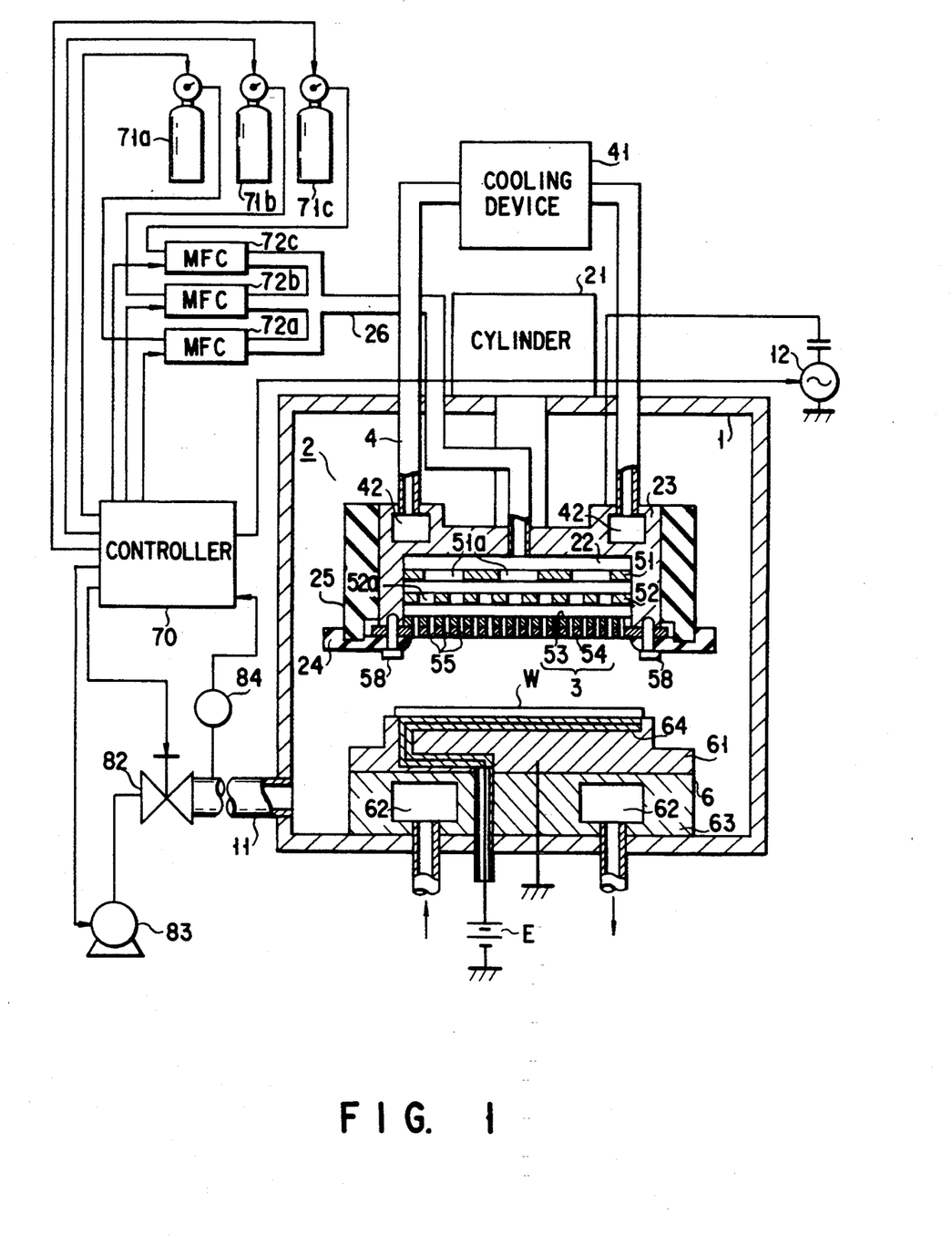
FIG. 1 schematically shows an entire plasma etching system according to one embodiment of the present invention.

Let us describe various embodiments of the present invention with reference to the accompanying drawings. First of all, FIG. 1 schematically shows the entire plasma etching system according to one embodiment of the present invention. As shown in the drawing, the system comprises a process chamber 1 hermetically defined by an aluminum wall. An electrode unit 2 movably supported by the rod of a cylinder 21 is mounted in an upper portion of the process chamber 1. The electrode unit 2 is movable in the vertical direction.

The electrode unit 2 is covered with a shielding ring 25 made of an insulating material. A cooling block 23 is positioned inside the shielding ring 25. A coolant supplied from a cooling device 41 flows through an inner passageway 42 formed inside the cooling block 23. Baffling plates 51 and 52 are mounted within a concavity of the cooling block 23. A shower electrode 3 is detachably mounted to the lower end portion of the cooling block 23 by a screw 58. The peripheral portion of the shower electrode 3 is urged toward the cooling block 23 by an insulating ring 24.

The shower electrode 3 comprises a cathode plate 54 made of an amorphous carbon and a cooling plate 53 bonded to the cathode plate 54. The cooling plate 53 is made of aluminum or an aluminum alloy. The shower electrode 3 is electrically connected to a high frequency power source 12 of 400 KHz and 1300 W, with a chuck electrode 61 positioned below the shower electrode 3 being connected to the ground. These shower electrode 3 and the chuck electrode 61 collectively form a plasma generating circuit.

The second baffle plate 52 is positioned right above the shower electrode 3, with the first baffle plate 51 being positioned right above the second baffle 10 plate 52. Further, a gas supply port of a pipe 26 is positioned right above the first baffle plate 51. These shower electrode 3 and the first and second baffle plates 51, 52 are disposed substantially horizontal and parallel with each other. A gas inlet chamber 22 is defined by the first baffle plate 51 and the cooling block 23. These first and second baffle plates 51, 52 and the shower electrode 3 are provided with small holes 51a, 52a and 55, respectively. The hole 51a has a diameter larger than that of the hole 52a. Also, the diameter of the hole 52a is larger than that of the hole 55. A cooling plate 53 is directly attached to the back surface of the cathode plate 54 of the shower electrode 3. The temperature of the cooling plate 53 is maintained at about 20° so as to cool the cathode plate 54. Each of these cooling block 23, and the first and second baffle plates 51, 52 is made of aluminum or an aluminum alloy.

One open end of the gas supply pipe 26 is positioned in the center in the upper portion of the gas inlet chamber 22. The gas supply pipe 26 is branched at its proximal end into three pipes which are connected to gas supply sources 71a, 71b and 71c through mass flow controllers (MFC) 72a, 72b and 72c, respectively. An Ar gas is housed in the gas supply source 71a. On the other hand, a $CF_4$ gas and a $CHF_3$ gas are housed in the gas supply sources 71b and 71c, respectively. Each of these gas supply sources 71a, 71b and 71c is provided with a pressure control valve. A power source for the movable portion of the pressure control valve is connected to the output portion of a controller 70. The power sources for the movable portions of MFC's 72a, 72b and 72c are also connected to the output portion of the controller 70. These MFC's 72a, 72b and 72c are controlled by the controller 70 independently of the gas supply sources 71a, 71b and 71c. To be more specific, the controller 70 permits each of these gas supply sources 71a, 71b and 71c to maintain a constant pressure. On the other hand, each of these MFC's 72a, 72b and 72c is controlled to maintain a constant gas flow rate.

A wafer holder 6 having the chuck electrode 61 mounted thereon is disposed in a lower portion of the process chamber 1. A wafer W is disposed on the chuck electrode 61 mounted on the wafer holder 6. An electrostatic chuck 64 to which is supplied a DC power from an external DC power source E is housed in the chuck electrode 61, which is made of aluminum or an aluminum alloy. The shower electrode 3 and the chuck electrode 61 are positioned vertically apart from each other by about 1 cm. A cooling block 63 provided with an inner fluid passageway 62 is attached directly to the lower surface of the chuck electrode 61. A coolant is supplied from a coolant supply source (not shown) into the inner passageway 62.

A discharge pipe 11 communicating with the suction port of a vacuum pump 83 is connected to the side wall at a lower portion of the process chamber 1. A valve 82 and a pressure sensor 84 is mounted to the discharge pipe 11. The pressure sensor 84 is connected to an input portion of the controller 70. The operations of both the valve 82 and the vacuum pump 83 are controlled on the basis of the pressure detected by the pressure sensor 84.

Figure 2:
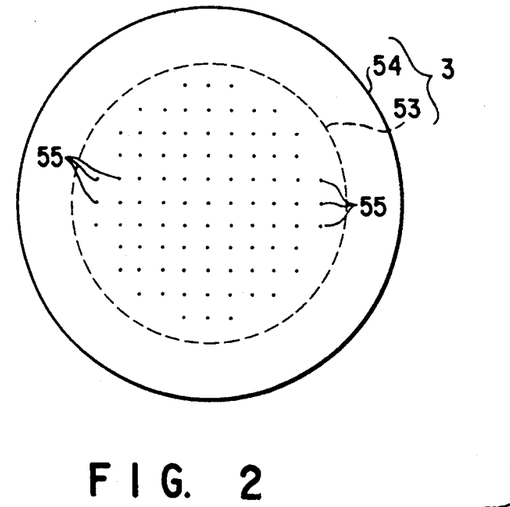
FIG. 2 is a plan view showing the shower electrode included in the system shown in FIG. 1.
Figure 3:
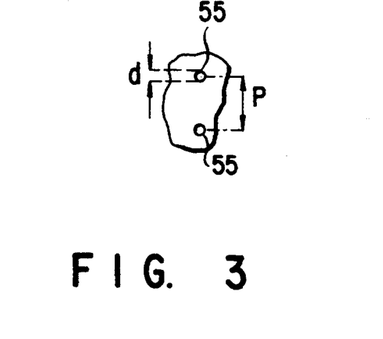
FIG. 3 is a plan view showing in a magnified fashion a part of the shower electrode shown in FIG. 2.
Figure 5:
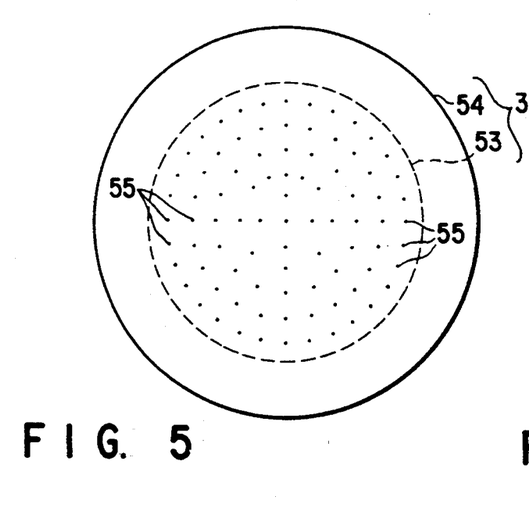
FIG. 5 is a plan view showing another shower electrode.
Figure 6:
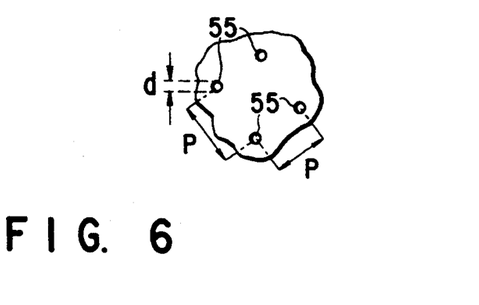
FIG. 6 is a plan view showing in a magnified fashion a part of the shower electrode shown in FIG. 5.

As shown in FIG. 2, the cathode plate 54 of the shower electrode 3 is in the form of a disk 4 mm thick. A large number of small holes 55 are formed in that region of the cathode plate 54 which is backed up by the cooling plate 53. FIG. 3 shows that these small holes 55, each having a diameter d of 0.6 mm, are arranged to form a lattice at a pitch P of 7 mm. The cathode plate 54 for a 8-inch wafer has a diameter of 285 mm. In this case, it is desirable to set the diameter of the gas spurting region, in which the small holes 55 are formed, at 180 mm or more. On the other hand, the cathode plate 54 for a 6-inch wafer has a diameter of 200 mm. In this case, it is desirable to set the diameter of the gas spurting region at 120 mm or more. Alternatively, the small holes 55 may be arranged radially with a constant pitch P as shown in FIGS. 5 and 6.

Figure 4:
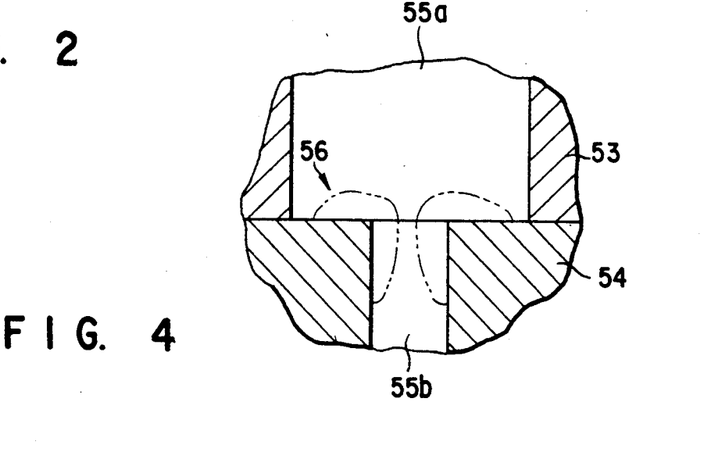
FIG. 4 is a cross sectional view showing a part of the small hole made in the shower electrode.

As shown in FIG. 4, a small hole 55b formed in the cathode plate 54 is smaller than a small hole 55a formed in the cooling plate 53. It follows that, if the plasma-forming gas flows at a low speed through these holes 55a and 55b, a polymer is deposited in a stepped portion 56 so as to obstruct the gas flow through the small hole 55b formed in the cathode plate 54.

In applying a plasma etching to a silicon wafer W using the etching system shown in FIG. 1, the wafer W is put on the chuck electrode 61 within the process chamber 1. As described previously, the wafer w is electrostatically held on the chuck electrode 61. Under this condition, an Ar gas, a $CF_4$ gas and a $CHF_3$ gas are introduced into the process chamber 1 through the shower electrode 3 while evacuating the process chamber 1 to set up an inner pressure of 0.5 Torr or less within the process chamber 1. Then, a high frequency voltage of 400 KHz is applied with a power of 1300 W between the cathode plate 54 and the chuck electrode 61 so as to generate a discharge plasma. The resultant plasma gas reacts with the wafer W so as to etch the wafer surface.

If the plasma-forming gas flows at such a low speed as 100 Km/h as in the conventional apparatus, the gas is subjected to a plasma polymerization within the small hole 55, with the result that the formed polymer is deposited on the circumferential wall of the hole 55. To overcome the difficulty, the plasma-forming gas is supplied to the hole 55 in the present invention at a mass flow rate of at least 620 kg/m²/hr so as to permit the gas to flow through the hole 55 at a speed higher than 100 Km/h.

Figure 7:
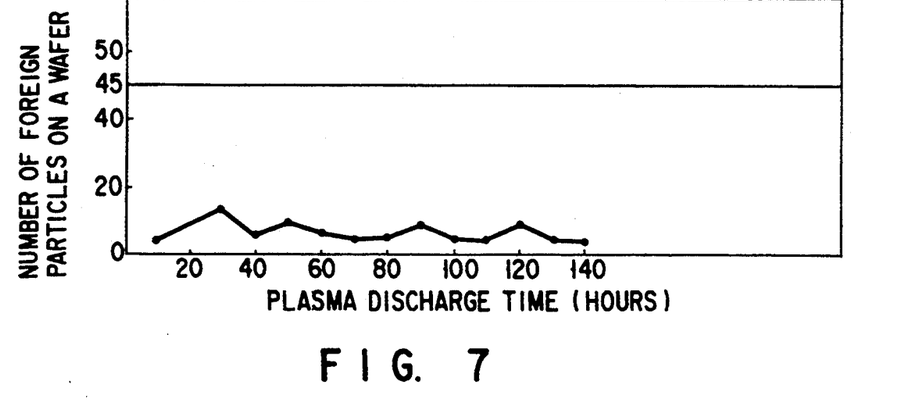
FIG. 7 is a graph showing an effect of the present invention.

Deposition of foreign particles (polymer) on a single wafer was measured to examine the wafer contamination. FIG. 7 is a graph showing the result. In the graph, the plasma discharge time is plotted on the ordinate, with the number of deposited foreign particles being plotted on the abscissa. A wafer having at least 45 foreign particles deposited thereon fails to provide a satisfactory semiconductor device. In the present invention, however, the number of deposited foreign particles is markedly smaller than 45 as shown in FIG. 7. It should be noted that, if the plasma-forming gas flows at a high speed, plasma is generated uniformly, and the pressure range within which discharge is performed stably is widened to cover a range of between 0.15 Torr and 3.0 Torr. As a result, it is possible to control as desired the aspect ratio of the plasma etching. In other words, each of the etching with a high aspect ratio and the etching with a low aspect ratio can be achieved in the present invention.

Figure 8:
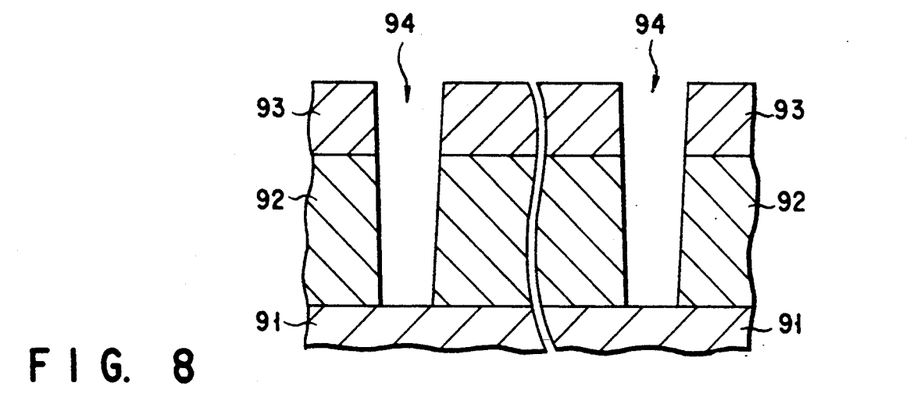
FIG. 8 is a cross sectional view showing in a magnified fashion a part of a wafer subjected to an anisotropic etching with a high aspect ratio.

FIG. 8 is a cross sectional view showing a wafer etched with a high aspect ratio. It is seen that the wafer is etched uniformly both in the central portion and in the peripheral portion.

Figure 9:
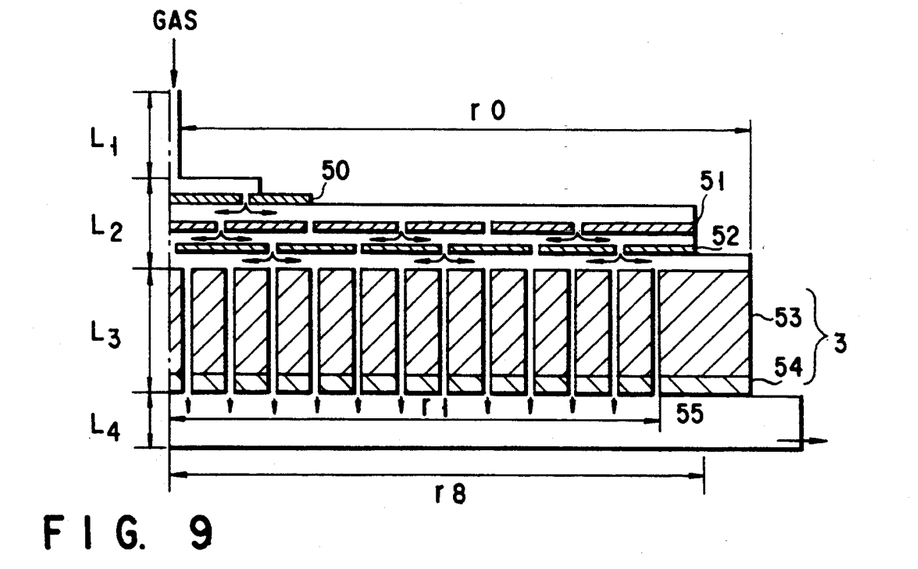
FIG. 9 is a cross sectional view schematically showing as a model the upper electrode unit included in the system shown in FIG. 1.
Figure 15:
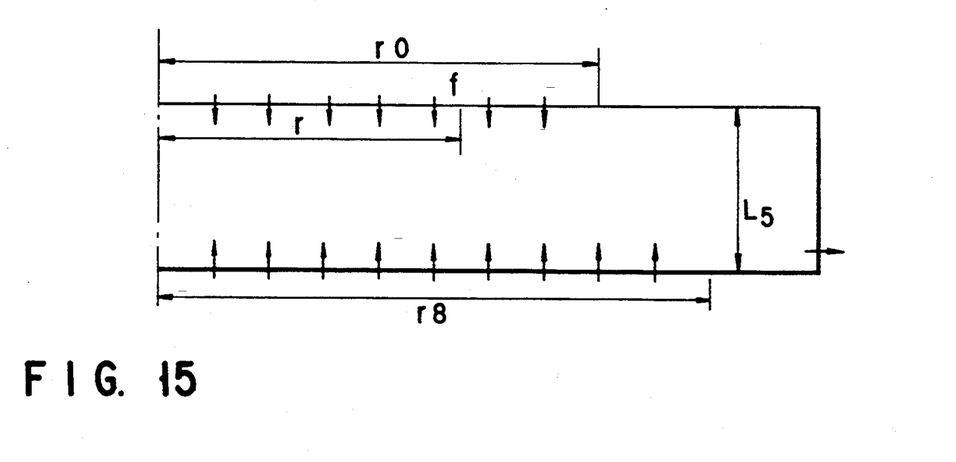
FIG. 15 schematically shows as a model the gas shower between the electrode and the wafer.

Let us study by means of a computer simulation the distribution of the flow speeds of the plasma-forming gas right above the wafer. For the sake of simplicity, the gas is assumed to be supplied uniformly from a shower head in this simulation, as shown in FIGS. 9 and 15.

Simulating Conditions

Shape of Model:

| | |
|---|---|
| Diameter (d) of gas spurting hole in the cathode plate (mm) | d = 0.6, 0.8 |
| Diameter of gas spurting region from the shower electrode (Shower diameter (mm)) | $\Phi = 2r_0$ = 160, 180, 210 |

Process Conditions:

Gas Composition . . . $CF_4$ 30 SCCM; $CHF_3$ 30 SCCM; Ar 600 SCCM

Gas Properties . . . The average properties of the mixed three gas of the composition given above were approximately determined by a several variable linear equation of temperature.

Gas Flowing State . . . Pressurized flow (change in density corresponding to inner pressure of process chamber being taken into account)

Inner Pressure . . . Reference pressure $P_8$ in the central portion of wafer upper surface is: $P_8 = 0.6$ Torr.

. . . Pressure difference $\Delta P$ between the reference point and the gas inlet port is: $\Delta P = 10.9$ Torr.

Temperature . . . In the case of calculating the gas flow rate, the constant temperature T within the region of calculation is 100° C.

. . . In the case of calculating the reaction, the constant temperature $T_8$ on the wafer is 60° C., and the constant temperature $T_9$ at the shower head is 250° C.

The gas flowing state within the process chamber is determined by a computer simulation in each of the cases where the shower diameter, i.e., the diameter of the gas spurting region on the electrode, is set at 160 mm, 180 mm and 210 mm. How the etching characteristics will be affected by the distribution of the gas flow speeds in the vicinity of the wafer will be studied on the basis of the gas flowing state thus determined. For the sake of simplicity, changes in the flowing state caused by the feed gas consumption and the by-product gas generation are neglected in this study.

Figure 10:
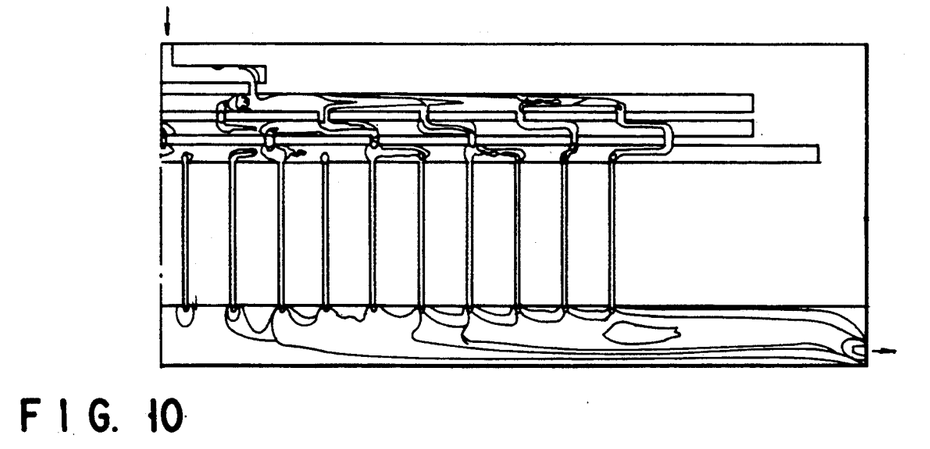
FIGS. 10 to 12 show simulation models each indicating the distribution of gas flow speeds.
Figure 11:
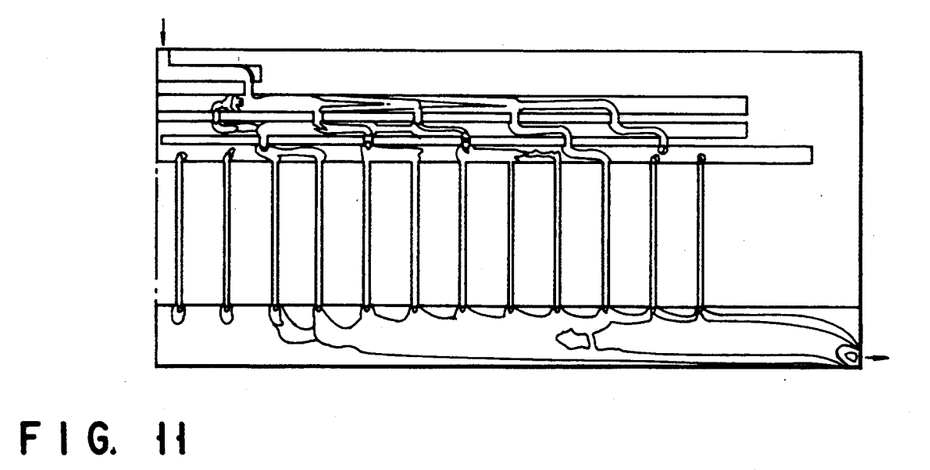
Figure 12:
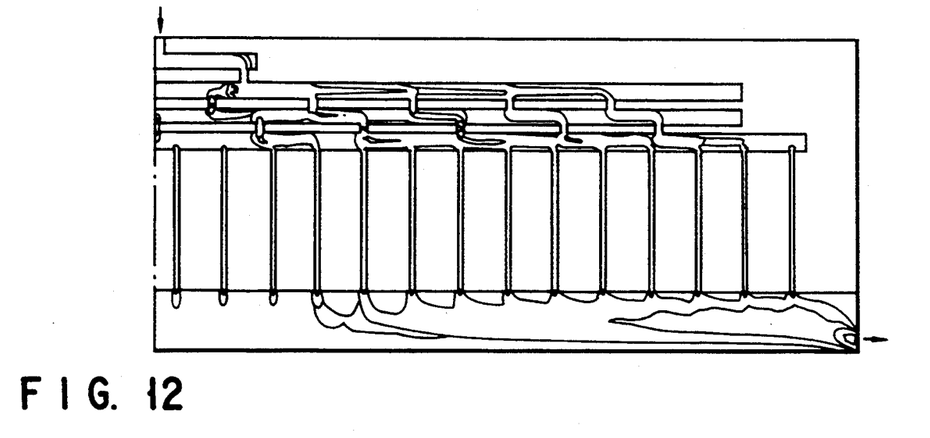

FIGS. 10 to 12 show the distributions of the gas flow speeds in the cases where the shower diameter was set at 160 mm, 180 mm and 210 mm. The shower electrode used in this experiment was provided with small holes each having a diameter of 0.6 mm, and used was a silicon wafer having a diameter of 8 inches. As apparent from the drawings, the gas is dispersed in the horizontal direction when flowing between the baffle plate 51 and the shower head 3. This implies that the baffle plates 51 and 52, which permit dispersing the gas, are incapable of making the gas flow speed uniform. On the other hand, the gas flowing speed is increased substantially uniformly from the central portion toward the peripheral portion when the gas flows between the shower head 3 and the wafer W. This indicates that the shower head 3 permits making the gas flowing speed uniform.

A baffle plate 50 shown in the uppermost portion of FIG. 9 serves to control the pressure of the plasma-forming gas introduced into the process chamber. The distances $L_1$ to $L_4$ and the radii $r_0$, $r_1$ shown in FIG. 9 are: $L_1=16$ mm; $L_2=16.5$ mm; $L_3=24$ mm (20 mm+4 mm); $L_4=10$ mm; $r_0=110.5$ mm; $r_1=160$ mm (or 180 mm or 210 mm).

Where the shower diameter is 160 mm, the gas flowing speed is rapidly increased from the wafer central portion toward the peripheral portion, as apparent from FIG. 10. Also, the gas flows at the highest speed in this case. On the other hand, where the shower diameter is 180 mm or 210 mm, the gas flowing speed from the central portion toward the peripheral portion is substantially constant, as seen from FIG. 11 or 12.

Figure 13:
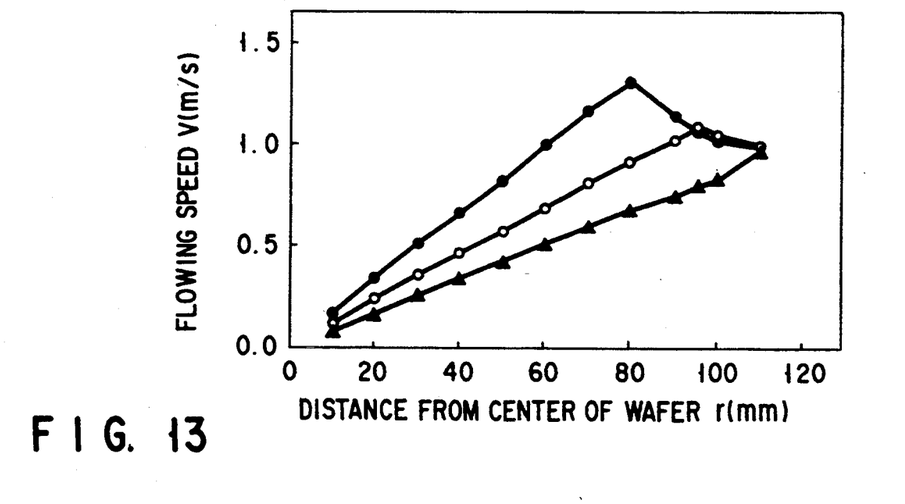
FIGS. 13 and 14 are graphs each showing the gas flow speeds right above the wafer.
Figure 14:
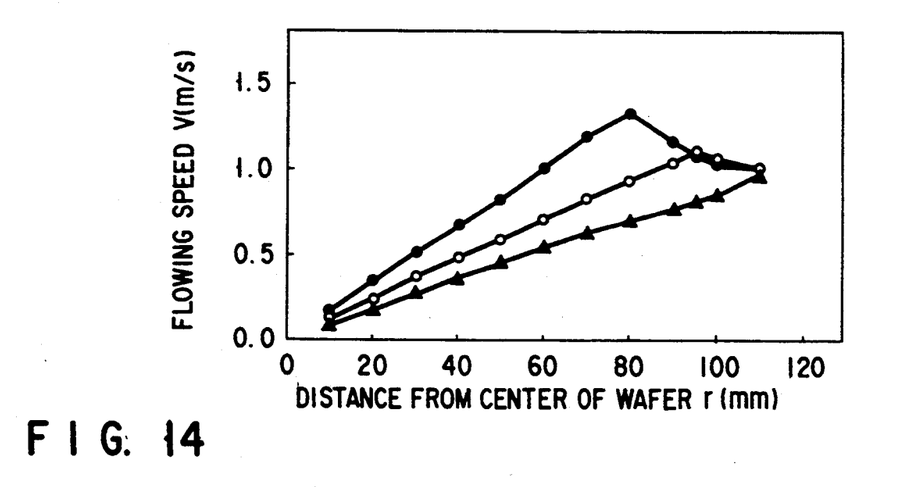

FIGS. 13 and 14 are graphs showing experimental data relating to distributions of the gas flowing speeds. In each of these graphs, the distance r (mm) from the center of the wafer is plotted on the abscissa, with the gas flowing speed v (m/sec) being plotted on the ordinate. Used in the experiment for FIG. 13 was a shower electrode provided with small holes each having a diameter of 0.6 mm. On the other hand, a shower electrode provided with small holes each having a diameter of 0.8 mm was used in the experiment for FIGS. 14. The black circular marks in these graphs denote the experimental data in the case of using a shower electrode having a diameter of 160 mm. Further, the white circular marks and the black triangular marks denote the experimental data in the cases of using shower electrodes having diameters of 180 mm and 210 mm, respectively.

FIGS. 13 and 14 indicate that the distribution of the gas flowing speeds right above the wafer is not dependent on the diameter d of the small hole made in the shower electrode. It is also shown that the gas flowing speed is linearly increased from the center of the wafer to reach the highest speed in the peripheral portion of the wafer. Where the shower diameter was 160 mm, the highest gas flowing speed of 1.32 m/sec was obtained at the distance r of 80 mm from the center of the wafer. Where the shower diameter was 180 mm, the highest gas flowing speed of 1.10 m/sec was obtained at the distance r of 95 mm from the center of the wafer. Further, where the shower diameter was 210 mm, the highest gas flowing speed of 0.98 m/sec was obtained at the distance r of 105 mm from the center of the wafer.

Let us study the distribution of the gas flowing speeds right above the wafer. As shown in FIGS. 13 and 14, the gas flowing speed in the radial direction of the wafer is gradually increased from the central portion to reach the highest speed in the vicinity of the periphery. Let us study the reason for the particular distribution of the gas flowing speeds.

In a model shown in FIG. 15, the gas is assumed to be supplied uniformly from the entire region of the shower head for the sake of simplicity. The following description covers case (a) where the distance r from the center of the wafer is not larger than the radius $r_0$ of the showering gas spurting region ($r \leq r_0$), and case (b) where the distance r is larger than the radius $r_0$ ($r > r_0$).

In the case of: $r \leq r_0$:

In the showering gas spurting region, the gas flow rate f per unit area of the shower head is given by formula (1), where $r_0$ denotes the diameter of the gas spurting region of the shower electrode, and $V_0$ represents the inlet gas flow rate:

$$f = V_0/\pi r_0^2 \qquad (1)$$

The gas flow rate at the position of the distance r is given by formula (2):

$$\begin{aligned} F &= \pi r^2 f \\ &= (r^2 V_0)/(r_0^2) \end{aligned} \qquad (2)$$

The cross sectional area S of the gas passageway through which flows a gas at a flow rate F is given by formula (3), where $L_5$ denotes the distance between the gas spurting hole and the upper surface of the wafer:

$$S = 2\pi r L_5 \qquad (3)$$

It follows that the gas flowing speed v is given by formula (4):

$$\begin{aligned} v &= F/S \\ &= (V_0/2\pi L_5 r_0^2) \cdot r \end{aligned} \qquad (4)$$

As seen from formula (4), the gas flowing speed v is increased in proportion to the distance r from the center of the wafer. Also, the gas flowing speed v is inversely proportional to $r_0^2$ and, thus, is markedly increased with decrease in the shower diameter $r_0$.

In the case of: $r > r_0$

In the region outside the showering gas spurting region, the gas flow rate F is equal to $V_0$ as shown in formula (5) because the gas is supplied to only within a range of the radius $r_0$ from the center:

$$F = V_0 \qquad (5)$$

The gas flowing speed v can be determined by formula (6) given below:

$$\begin{aligned} v &= F/S \\ &= (V_0/2\pi L_5) \cdot (1/r) \end{aligned} \qquad (6)$$

Formula (6) indicates that the gas flowing speed v is lowered with increase in the distance r from the center of the wafer, and is not dependent on $r_0$.

Table 1 shows experimental data on the relationship between the gas flowing speed and the etching rate. In the experiment, each of the gas flowing speed and the etching rate was measured at a point 90 mm apart from the center of the wafer. As apparent from Table 1, the etching rate is lowered with increase in the shower diameter $2r_0$ and with decrease in the gas flowing speed. It should be noted in this connection that, if the gas flowing speed is low, the by-product gas resulting from the etching reaction is unlikely to be discharged and tends to reside in the vicinity of the wafer surface, leading to a low etching rate noted above.

TABLE 1

| $2r_0$ (mm) | Gas Flowing Speed | Etching Rate |
|---|---|---|
| 160 | 1.150 (m/sec) | 5024 (Å/min) |
| 180 | 1.033 (m/sec) | 5023 (Å/min) |
| 210 | 0.7605 (m/sec) | 4770 (Å/min) |

Tables 2 and 3 show experimental data on the relationship between the gas concentration and the shape of the contact hole. The data given in Table 2 were obtained at a point 10 mm apart from the center of the wafer, with the data given in Table 3 being obtained at a point 90 mm apart from the center of the wafer. The term "tapering angle" shown in each of these Tables denotes the angle of inclination of the circumferential side wall defining the contact hole 94 shown in FIG. 8. As seen from Tables 2 and 3, the tapering angle is diminished with increase in the shower diameter $2r_0$ and with decrease in the gas flowing speed. It should be noted in this connection that, if the gas flowing speed is low, the by-product gas resulting from the etching reaction is unlikely to be discharged and tends to reside in the vicinity of the wafer surface, leading to a diminished tapering angle.

TABLE 2

| $2r_0$ (mm) | Gas Flowing Speed | Tapering Angle |
|---|---|---|
| 160 | 0.1660 (m/sec) | 88.0° |
| 180 | 0.1160 (m/sec) | 86.8° |
| 210 | 0.8696 (m/sec) | 85.8° |

TABLE 3

| $2r_0$ (mm) | Gas Flowing Speed | Tapering Angle |
|---|---|---|
| 160 | 1.150 (m/sec) | 87.6° |
| 180 | 1.033 (m/sec) | 87.0° |
| 210 | 0.7605 (m/sec) | 86.0° |

Let us study the etching reaction by means of a computer simulation.

Figure 16:
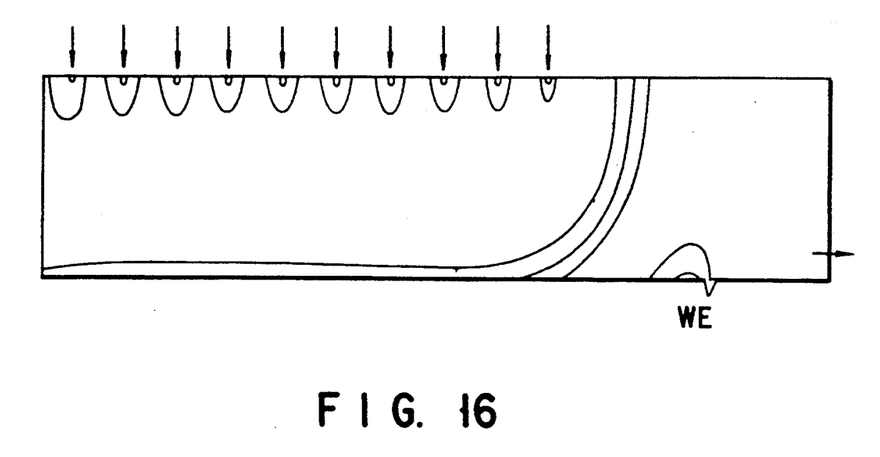
FIGS. 16 to 18 show simulation models each indicating the distribution of $SiF_4$ gas concentrations.
Figure 17:
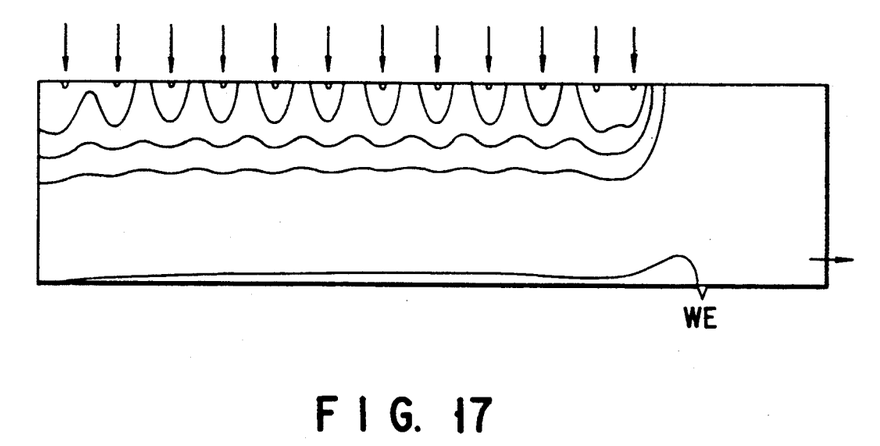
Figure 18:
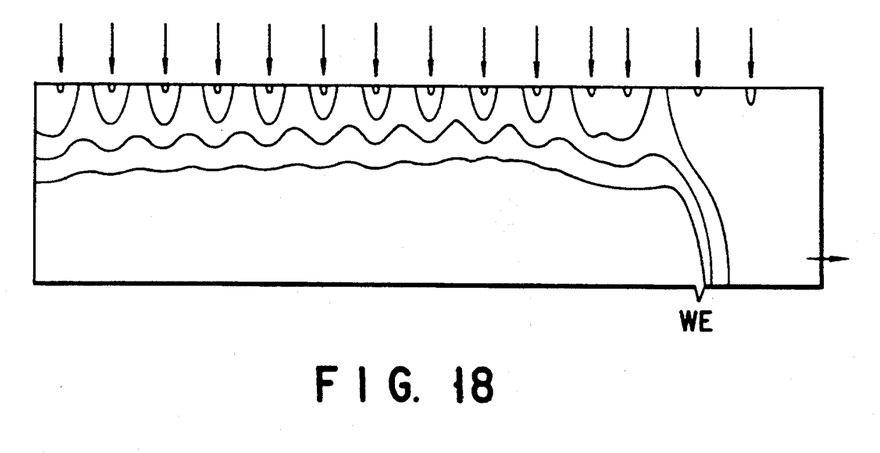

FIGS. 16 to 18 show simulation models each indicating the distribution of the $SiF_4$ gas concentrations in the plasma-forming region, which has been modeled by a reaction simulation. The letters WE in each of these drawings denote where the wafer edge portion was positioned. As shown in the drawings, the gas was supplied from above the wafer and allowed to flow to the right so as to be discharged.

Reaction proceeds in the plasma-forming region as denoted by formula (7) to form a by-product gas of $SiF_4$:

$$SiO_2 + CF_4 \rightarrow SiF_4 + CO_2 \quad (7)$$

In the vicinity of the wafer, the by-product gas is also involved in the reaction together with the feed gas. The etching rate is dependent on both the $CF_4$ gas concentration and the $SiF_4$ gas concentration. On the other hand, the shape of the contact hole is dependent on the $CFH_3$ gas concentration and the $SiF_4$ gas concentration. It follows that it is important to know the concentration distribution of the by-product gas of $SiF_4$ together with the concentration distributions of the feed gases of $CF_4$ and $CHF_3$.

Figure 19:
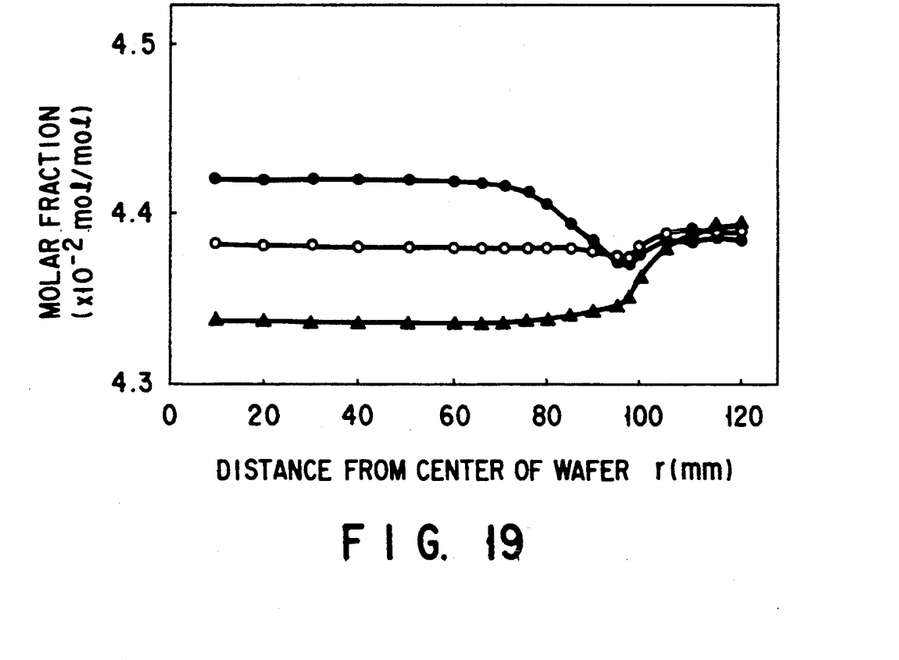
FIG. 19 is a graph showing the $CF_4$ gas concentration right above the wafer.
Figure 20:
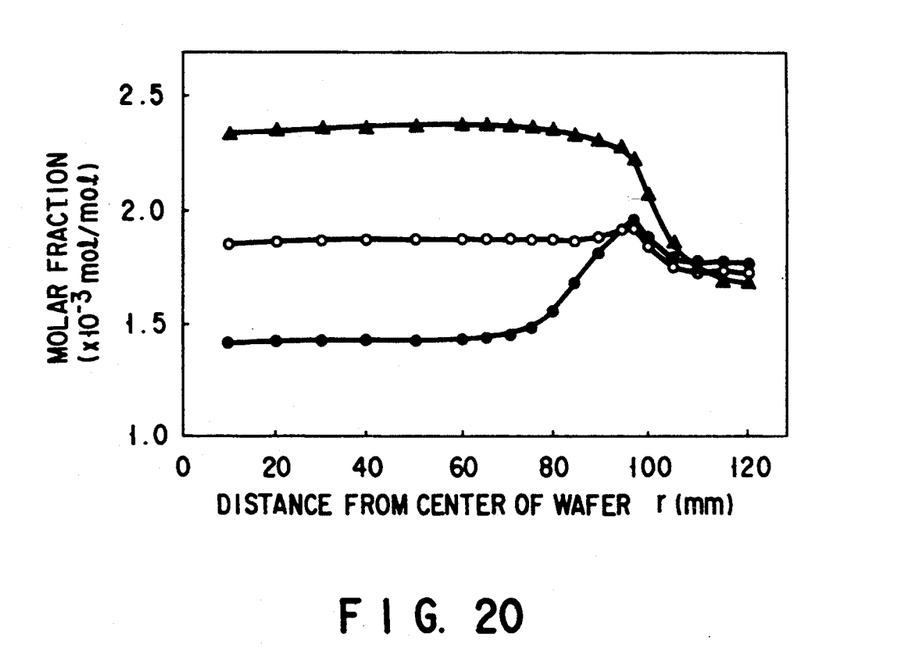
FIG. 20 is a graph showing the $SiF_4$ gas concentration right above the wafer.

As shown in FIGS. 19 and 20, the feed gas and the by-product gas right above the wafer are distributed such that the concentrations of these gases are uniform in the central portion of the wafer and are changed in the vicinity of the wafer edge portion.

Table 4 shows the experimental data indicating the relationship between the shower diameter $2r_0$ and the distribution of the $CF_4$ concentrations. The percentages put in parentheses in Table 4 denote the rate of reduction in the $CF_4$ concentration right above the wafer relative to the initial $CF_4$ concentration of $4.5454 \times 10^{-2}$ (mol/mol) on the side of the gas inlet port. In this experiment, the $CF_4$ gas concentration was measured right above the wafer.

In the case where the shower diameter $2r_0$ was 160 mm, the difference between the $CF_4$ concentration right above the wafer and the initial concentration was 3.6%. Also, the difference in the $CF_4$ concentration within the region of the wafer was only 1%. On the other hand, where the shower diameter $2r_0$ was 180 mm, the difference between the $CF_4$ concentration right above the wafer and the initial concentration was also 3.6%. Also, the difference in the $CF_4$ concentration within the region of the wafer was only 0.1%. Further, where the shower diameter $2r_0$ was 210 mm, the difference between the $CF_4$ concentration right above the wafer and the initial concentration was 4.6%. The difference in this case was larger than in the cases where the shower diameters were 160 mm and 180 mm, respectively, and thus, is not negligible. Also, the difference in the $CF_4$ concentration within the region of the wafer was only 0.2%.

It should be noted that the gas concentration reaches the largest value in the case where the shower diameter is 160 mm (gas feeding speed of 10.6 m/sec) and the smallest value in the case where the shower diameter is 210 mm (gas feeding speed of 5.70 m/sec). However, the difference in the gas concentration between these two cases is as small as only 1.5%. Also, the difference in the $CF_4$ concentration within the region of the wafer is as small as less than 1%. In other words, the difference in the shower diameter does not bring about a remarkable difference in the $CF_4$ gas (feed gas) concentration within the region of the wafer.

TABLE 4

| | $CF_4$ Concentration (mol/mol) | |
|---|---|---|
| $2r_0$ (mm) | Wafer Central Portion | Wafer Peripheral Portion |
| 160 | $4.4211 \times 10^{-2}$ (2.8%) | $4.3744 \times 10^{-2}$ (3.8%) |
| 180 | $4.3818 \times 10^{-2}$ (3.6%) | $4.3755 \times 10^{-2}$ (3.7%) |
| 210 | $4.3386 \times 10^{-2}$ (4.6%) | $4.3471 \times 10^{-2}$ (4.4%) |

Table shows the experimental data indicating the relationship between the shower diameter $2r_0$ and the $SiF_4$ gas concentration. In this experiment, the gas concentration was measured right above the wafer. Where the shower diameter $2r_0$ is 160 mm, the $SiF_4$ concentration in the peripheral portion is higher than in the central portion. Also, the difference in the $SiF_4$ concentration between the intermediate portion and the peripheral portion of the wafer is only 1%, whereas, the difference between the central portion and the peripheral portion is as large as 36%. The difference in the $SiF_4$ concentration within the region of the wafer is particularly large in this case.

Where the shower diameter $2r_0$ is 180 mm, the difference in the $SiF_4$ concentration between the central portion and the intermediate portion of the wafer is 1%. Also, the difference between the central portion and the peripheral portion is 3%. The difference in the $SiF_4$ concentration within the region of the wafer is not large in this case.

where the shower diameter $2r_0$ is 210 mm, the difference in the $SiF_4$ concentration between the central portion and the intermediate portion of the wafer is 1%. Also, the difference between the central portion and the peripheral portion is 3.2%. The difference in the $SiF_4$ concentration within the region of the wafer is not large in this case.

Where the shower diameter is 210 mm, the $SiF_4$ concentration in the wafer central portion is higher by about 40% than in the case where the shower diameter is 160 mm. Also, the difference in the SiF$_4$ concentration within the region of the wafer in the case where the shower diameter is 160 mm is markedly larger than in the case where the shower diameter is 210 mm.

TABLE 5

| Shower Diameter (mm) | SiF$_4$ Concentration (mol/mol) in Wafer Region | | |
| --- | --- | --- | --- |
| | Central Portion | Intermediate Portion | Peripheral Portion |
| 160 | 1.4168 × 10$^{-3}$ | 1.4299 × 10$^{-3}$ | 1.9257 × 10$^{-3}$ |
| 180 | 1.8512 × 10$^{-3}$ | 1.8700 × 10$^{-3}$ | 1.9145 × 10$^{-3}$ |
| 210 | 2.3299 × 10$^{-3}$ | 2.3583 × 10$^{-3}$ | 2.2573 × 10$^{-3}$ |

Let us study the distribution of the SiF$_4$ gas based on the experimental data given above. For the sake of simplicity, the gas is assumed to be uniformly supplied from the entire region of the shower head, as shown in FIG. 15. The total amount B of SiF$_4$ gas at a point apart by a distance r from the center of the wafer is given be formula (8), where b denotes the amount of SiF$_4$ generated per unit area of the wafer:

$$B = \pi r^2 \cdot b \qquad (8)$$

The following description covers the case where the distance r from the center of the wafer is not larger than the radius of the gas spurting region of the shower electrode, i.e., the shower radium $r_0$, the case where the distance r falls within a range of between the shower radium $r_0$ and the wafer radius $r_8$, and the case where the wafer radius $r_8$ is not larger than the distance r noted above.

(c) In the case of: $r \leq r_0$

Within the showering gas spurting region, the concentration C of the SiF$_4$ gas is given by formula (9). Incidentally, the feed gas flow rate F included in formula (9) is given by formula (2) pointed out previously.

$$C = B/F = (\pi b/V_0) r_0^2 \qquad (9)$$

Formula (9) indicates that the SiF$_4$ concentration C is increased with increase in the showering radius $r_0$.

(d) In the case of: $r_0 \leq r \leq r_8$

Within this region, the feed gas flow rate F is given by formula (5) pointed out previously. On the other hand, since the showering gas is spurted toward the wafer within this region, SiF$_4$ is formed. Thus, the concentration C of SiF$_4$ is given by formula (10):

$$C = B/F = (\pi b/V_0) r_0^2 \qquad (10)$$

Within this region, the SiF$_4$ concentration is not dependent on the showering radius $r_0$, and is increased with increase in the distance r from the center of the wafer.

(e) In the case of: $r_8 \leq r$

Within this region, i.e., within the region far apart from the wafer, the total amount B of SiF$_4$ is given by formula (11):

$$B = \pi r_8^2 \cdot b \qquad (11)$$

Thus, the concentration C of SiF$_4$ is given by formula (12). Incidentally, the feed gas flow rate F included in formula (12) is given by formula (2) pointed out previously.

$$C = B/F = (\pi r_8^2 r_0^2 b / V_0) \cdot (1/r^2) \qquad (12)$$

Within this region, the SiF$_4$ concentration C is increased with increase in the showering radius $r_0$, and is decreased with increase in the distance r from the center of the wafer, as shown in formula (12).

Table 6 shows the experimental data indicating the relationship between the gas concentration and the etching rate. The gas concentration (molar fraction) for each of the CF$_4$ gas and the SiF$_4$ gas was measured in this experiment as a point 90 mm apart from the center of the wafer. The etching rate was also measured at a point 90 mm apart from the center of the wafer. As apparent from Table 6, the etching rate in the case where the shower diameter $2r_0$ was 210 mm was higher by 5% (4770/5024=0.95) higher than in the case where the shower diameter was 160 mm. Since these two cases were substantially equal to each other in the CF$_4$ molar fraction, the above-noted difference in the etching rate was clearly brought about by the difference in the SiF$_4$ molar fraction between these two cases. This clearly supports that the etching rate is highly dependent on the concentration of the by-product gas of SiF$_4$.

Where SiF$_4$ is assumed to be adsorbed on the surface of the silicon wafer, the amount of adsorption on the wafer surface is increased with increase in the SiF$_4$ concentration so as to inhibit the etching reaction. It is desirable in this case to employ the Lang Muier adsorption isothermic formula as a formula of the reaction speed. It should also be noted that the uniformity of etching is improved with increase in the shower diameter $2r_0$.

TABLE 6

| $2r_0$ (mm) | CF$_4$ molar Fraction | SiF4 molar Fraction | Etching Rate (Å/min) |
| --- | --- | --- | --- |
| 160 | 4.384 × 10$^{-2}$ | 1.814 × 10$^{-3}$ | 5024 (6.9%) |
| 180 | 4.379 × 10$^{-2}$ | 1.873 × 10$^{-3}$ | 5023 (6.4%) |
| 210 | 4.343 × 10$^{-2}$ | 2.294 × 10$^{-3}$ | 4770 (5.2%) |

Tables 7 and 8 show experimental data each indicating the relationship between the gas concentration and the shape of the contact hole. The data shown in Table 7 are those measured at a point 10 mm apart from the center of the wafer, with Table 8 showing the data measured at a point 90 mm apart from the center of the wafer. The term "tapering angle" indicated in each of Tables 7 and 8 denotes the angle of inclination of the circumferential wall defining the contact hole 94 shown in FIG. 8.

The experimental data shown in Tables 7 and 8 support that the tapering angle is diminished with increase in the shower diameter $2r_0$ and with decrease in the CF$_4$ concentration regardless of the measuring position.

TABLE 7

| $2r_0$ (mm) | CF$_4$ molar Fraction | SiF$_4$ molar Fraction | Tapering Angle (°) |
| --- | --- | --- | --- |
| 160 | 4.421 × 10$^{-2}$ | 1.417 × 10$^{-3}$ | 88.0 |
| 180 | 4.382 × 10$^{-2}$ | 1.851 × 10$^{-3}$ | 86.8 |
| 210 | 4.339 × 10$^{-2}$ | 2.330 × 10$^{-3}$ | 85.8 |

TABLE 8

| $2r_0$ (mm) | CF$_4$ molar Fraction | SiF$_4$ molar Fraction | Tapering Angle (°) |
| --- | --- | --- | --- |
| 160 | 4.384 × 10$^{-2}$ | 1.814 × 10$^{-3}$ | 87.6 |
| 180 | 4.379 × 10$^{-2}$ | 1.873 × 10$^{-3}$ | 87.0 |
| 210 | 4.343 × 10$^{-2}$ | 2.294 × 10$^{-3}$ | 86.0 |

In the embodiments described above, a plasma etching (PE) mode is employed as a method of applying a high frequency power. Alternatively, a power split mode or a reactive ion etching (RIE) mode can also be employed in place of the plasma etching mode.

According to the plasma etching system of the present invention, a polymer is not deposited to the gas spurting hole formed in the shower electrode, making it possible to use the shower electrode stably and continuously over a long period of time. Naturally, the wafer is not contaminated with the polymer formed in the etching step, leading to a marked improvement in the yield of the semiconductor device.

What should also be noted is that, since the feed gas flows through the small holes made in the shower electrode at a high speed, the etching can be achieved with a desired aspect ratio falling within a wide range of aspect ratios. Further, the high flowing speed of the feed gas through the small holes made in the shower electrode makes it possible to improve the uniformity of the formed plasma, with the result that the stable region of the plasma discharge can be widened to fall within a range of between 0.15 to 3.0 Torr. It follows that the etching can be achieved with such a high aspect ratio as 3.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma etching system, comprising:
   a process chamber enclosing a plasma;
   means for evacuating said process chamber;
   a chuck electrode for supporting a substrate;
   a shower electrode for forming a plasma discharge circuit between said chuck electrode and said shower electrode;
   a power source for applying a plasma voltage between the chuck electrode and said shower electrode; and
   gas supply means for supplying a plasma-forming gas into the process chamber;
   wherein the shower electrode includes:
      a cathode plate facing a substrate on the chuck electrode;
      a cooling plate laminated on said cathode plate to cool the cathode plate;
      a number of gas inlet holes formed in said cooling plate for introducing said gas from said gas supply means;
      a number of small holes formed in the cathode plate to communicate with said gas inlet holes, each of said small holes having an open end facing the chuck electrode being smaller in diameter than the gas inlet holes, and having a stepped portion in a region where said small hole communicates with the gas inlet hole; and
      control means for controlling the gas supply means such that said gas flows through the stepped portion between the small hole and the gas inlet hole at a mass flow rate of at least 620 kg/m$^2$/hour, thereby preventing a component of said gas from being deposited on the stepped portion.

2. The plasma etching system according to claim 1, wherein a spurting region of the plasma-forming gas from the small holes made in said shower electrode covers a range of up to 180 mm from a center of the shower electrode.

3. The plasma etching system according to claim 1, wherein a spurting region of the plasma-forming gas from the small holes made in said shower electrode covers a range of up to 180 mm and not smaller than 120 mm from a center of the shower electrode.

4. The plasma etching system according to claim 1, wherein said shower electrode is provided with small holes provided at a pitch of at least 6 mm.

5. The plasma etching system according to claim 1, wherein said shower electrode is provided with small holes each having a gas spurting diameter of less than 0.8 mm.

* * * * *